United States Patent [19]
Chen

[11] Patent Number: 6,003,118
[45] Date of Patent: Dec. 14, 1999

[54] METHOD AND APPARATUS FOR SYNCHRONIZING CLOCK DISTRIBUTION OF A DATA PROCESSING SYSTEM

[75] Inventor: Wei-Lun Chen, Taipei, Taiwan

[73] Assignee: Acer Laboratories Inc., Taipei, Taiwan

[21] Appl. No.: 08/991,768

[22] Filed: Dec. 16, 1997

[51] Int. Cl.[6] ............................... G06F 12/00; H04L 7/00
[52] U.S. Cl. ........................................... 711/167; 713/401
[58] Field of Search ........................... 711/167; 713/400, 713/401

[56] References Cited

U.S. PATENT DOCUMENTS

| | | | |
|---|---|---|---|
| 5,475,690 | 12/1995 | Burns et al. | 370/519 |
| 5,481,573 | 1/1996 | Jacobowitz et al. | 375/356 |
| 5,815,462 | 9/1998 | Konishi et al. | 365/233 |

*Primary Examiner*—David L. Robertson
*Attorney, Agent, or Firm*—Robert H. Chen

[57] ABSTRACT

This invention discloses a novel design to solve the clock skew problems in a data processing system by using PLL circuitry inside a memory controller in combination with an adjustable delay element to provide a write clock signal, a read clock signal, and a memory clock signal for triggering the write data buffer and the read buffer of the memory controller, and the memory module respectively. The memory clock signal has a phase lead relative to the read clock signal and a phase lag relative to the write clock signal. The phase lead and the phase lag compensate for phase differences between clock signals arriving at the read data buffer and the write data buffer of the memory controller, and the memory module respectively due to phase delays resulting from the different paths for transmitting clock signals, thereby synchronizing the clock signals.

17 Claims, 5 Drawing Sheets

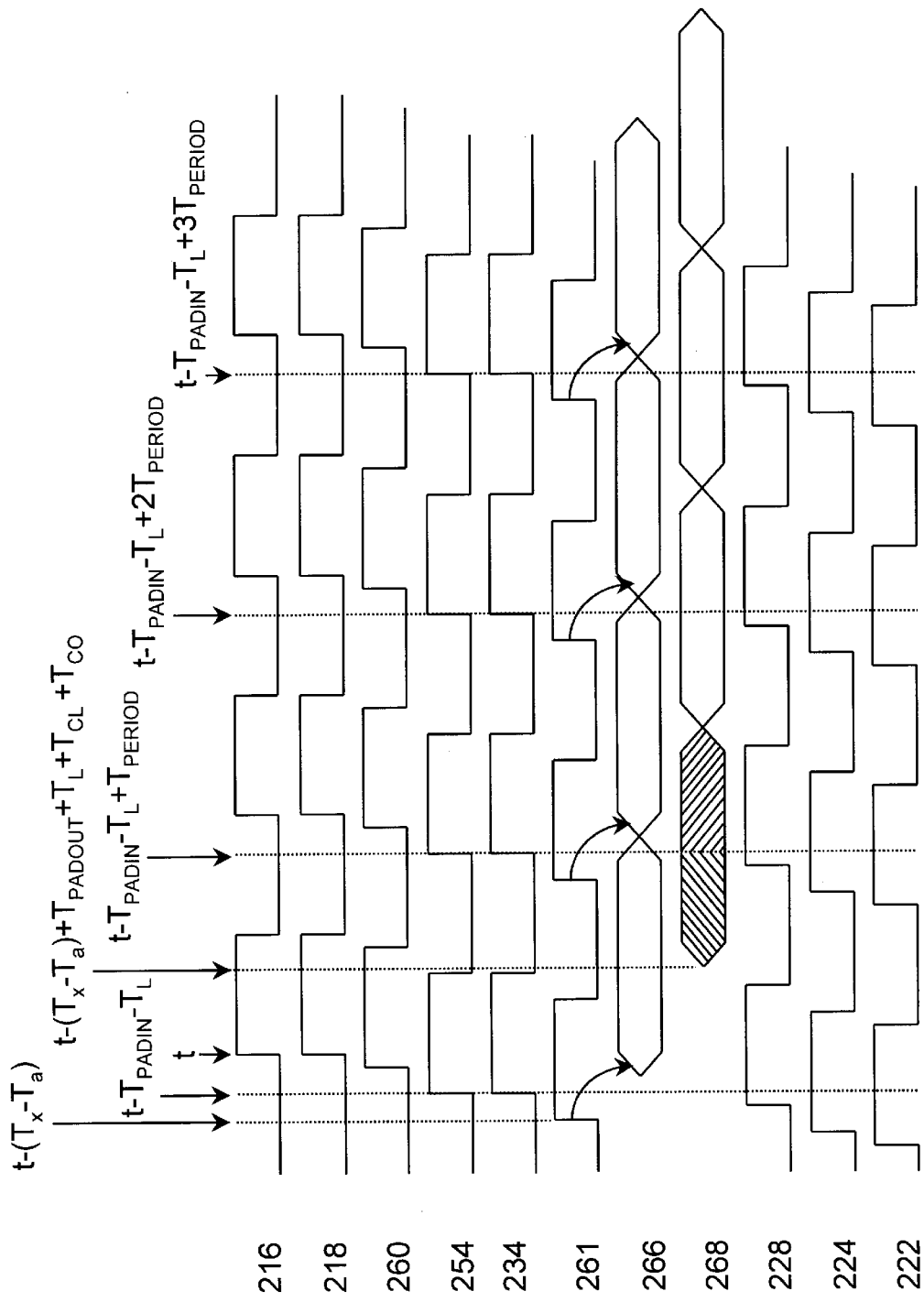

METHOD AND APPARATUS FOR SYNCHRONIZING CLOCK DISTRIBUTION OF A DATA PROCESSING SYSTEM

BACKGROUND OF THE INVENTION

1. Field of the Invention

This invention relates generally to a data processing system with memory, and more particularly to a data processing system having a chipset with phase lock loop circuitry for synchronizing clock signal distribution for memory read/write operations.

2. Background of the Invention

With the rapid development of data processing technology, high speed devices such as the Intel Pentium II CPU chip, operating at frequencies up to 266 MHz, and SDRAMs, operating at frequencies of 100 MHz, are widely used. Though the core frequencies of CPUs and memories have risen above 100 MHz, the data buses transmitting data between the CPU and the memory chips have been limited to operating frequencies of approximately 66 MHz. The main reason for the speed discrepancy between chips and buses is that as the data bus operating frequency increases, a phase difference (clock skew) between different components located at different distances from the system clock generator becomes more serious; even to the extent of making the setup time insufficient for data strobe.

Conventional methods eliminate clock skew by designing the circuit board to have the same trace length from the different components to the system clock generator. Another approach is to employ delay elements on the shorter signal lines to produce phase delays to match the longer lines. Sometimes the phase delays need to be matched where signals run throughout various components. These phase delays then are the sum of the delay due to the circuit board signal lines plus the delay due to the components.

FIG. 1 illustrates a simplified block diagram of a conventional data processing system 190. A clock generator with a driver 101 provides skewless clock signals for a memory controller chip 102 and SDRAM 103 via signal lines 104 and 105 respectively. Memory controller 102 includes a write data buffer 106 for data write and a read data buffer 107 for data read. The clock signal is transmitted to memory controller 102 via a signal line 104 and an input pad 108 to a clock trunk 114 inside memory controller 102, and distributed to all components inside memory controller 102, including write data buffer 106 and read data buffer 107. Data is transmitted from an output pad 110 to an input port 112, and from an output port 113 to an input pad 109 via a data bus 111. Input pad 109 and output pad 110 are pads connected to the I/O pins of memory controller 102. Input port 112 and output port 113 are data ports of SDRAM 103. The data is transmitted between memory controller 102 and SDRAM 103 in accordance with a command signal for data read/write operation (the command signal is not shown in the figure).

For a read cycle, the clock signal triggers read data buffer 107 so that upon the arrival of data from SDRAM 103, there will be sufficient setup time for correct data strobe. Similarly, for a write cycle, the clock signal triggers SDRAM 103 so that upon arrival of data from write data buffer 106, there will be sufficient setup time for correct data strobe. Accordingly, for clock consistency, it is necessary to maintain the equivalent trace length from clock generator 101 to different components through signal lines such as 104 and 105.

However, as operating frequencies increase, e.g., above 100 MHz, such conventional methods may not be appropriate. This is because as the clock cycle becomes shorter, the tolerance to the deviation of trace length between signal lines is reduced. This sets an extremely stringent precision requirement which may be difficult to meet with present layout technology.

For example, under operating frequencies of 66 MHz, 100 MHz, and 133 MHz, the clock period is 15 ns, 10 ns, and 7.5 ns respectively. That means the clock period is reduced from 15 to 7.5 ns due to the increase in the operation frequency. However, with present layout technology, trace length deviations are about one inch or more between different signal lines. This will result in a phase delay of 0.25 ns between the signal lines. This will be exacerbated if the clock signal passes through various components on the circuit board. This reduced tolerance becomes critical to avoid incorrect data strobe operation resulting from insufficient setup time. In theory, the circuit board layout can be designed to achieve the required tolerances, but this will result in higher design, testing, and manufacturing costs.

SUMMARY OF THE INVENTION

What is needed therefore, is a system which will achieve the trace length deviation tolerances without increasing the complexity of design, additional testing, and higher manufacturing costs. A phase lock loop (PLL) circuit typically comprises a phase detector (PD), a low pass filter (LPF), and a voltage control oscillator (VCO). A feedback loop is provided from the output of the VCO to the input of the PD. This invention utilizes PLL circuitry to synchronize the clock signals of memory controller chipsets with the clock signals of memory chips to solve the above-described clock skew problems. The invention comprises a memory controller having PLL circuitry and an adjustable delay element to synchronize clock signals of components inside the chip with the clock signals of components outside the chip to obtain a more reliable setup time for correct data read/write operation under the requirements of modern higher operating frequencies.

In accordance with the present invention, a data processing system comprises a clock generator for generating a clock signal, a memory module for storing data, and a memory controller coupled to the clock generator. The memory controller is used for compensating for phase differences between clock signals arriving at a read data buffer and a write data buffer of a memory controller, and a memory module respectively. The phase differences due to phase delays result from the different paths among the clock generator and the memory module, the read data buffer, and the write data buffer respectively. The memory controller comprises phase lock loop means and synchronization means. The phase lock loop means, responsive to the clock signal, is used for generating a read clock signal for the read data buffer and a write clock signal for the write data buffer, wherein the write clock signal leads the read clock signal. The synchronization means is used for generating a memory clock signal for the memory module in response to the read clock signal and the memory clock signal fedback from the memory module. The memory clock signal has a phase lead relative to the read clock signal and has a phase lag relative to the write clock signal, thereby synchronizing the clock signals.

One advantage of the present invention is to provide a simpler and more cost effective method of synchronizing clock signals in data processing systems.

Another advantage of the present invention is that the PLL circuitry provides a lead phase of the clock signal transmitted to the memory module over the clock signal transmitted to the memory controller read data buffers to obtain more setup time for more accurate data processing operations.

Still another advantage of the present invention is that the phase difference of the clock signal transmitted to the memory controller write data buffers and the memory module can be adjusted by an adjustable delay element to satisfy the requirements of setup time and hold time for correct data processing operations.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF THE DRAWINGS

FIG. 4 is a timing diagram for a data write cycle in accordance with the present invention.

DESCRIPTION OF THE INVENTION

Figure 1:
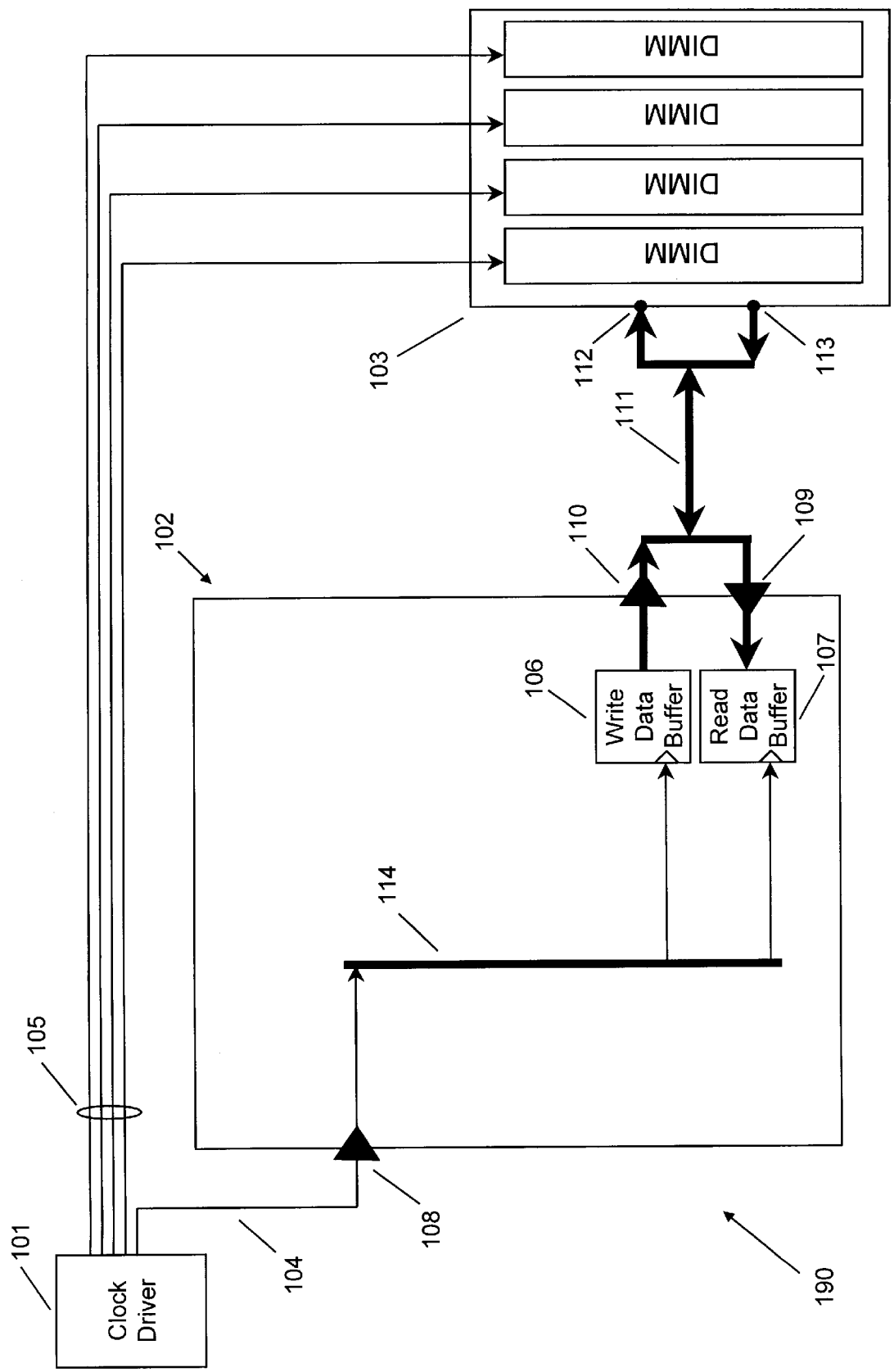
FIG. 1 is a simplified block diagram of a prior art data processing system with memory read/write.
Figure 2A:
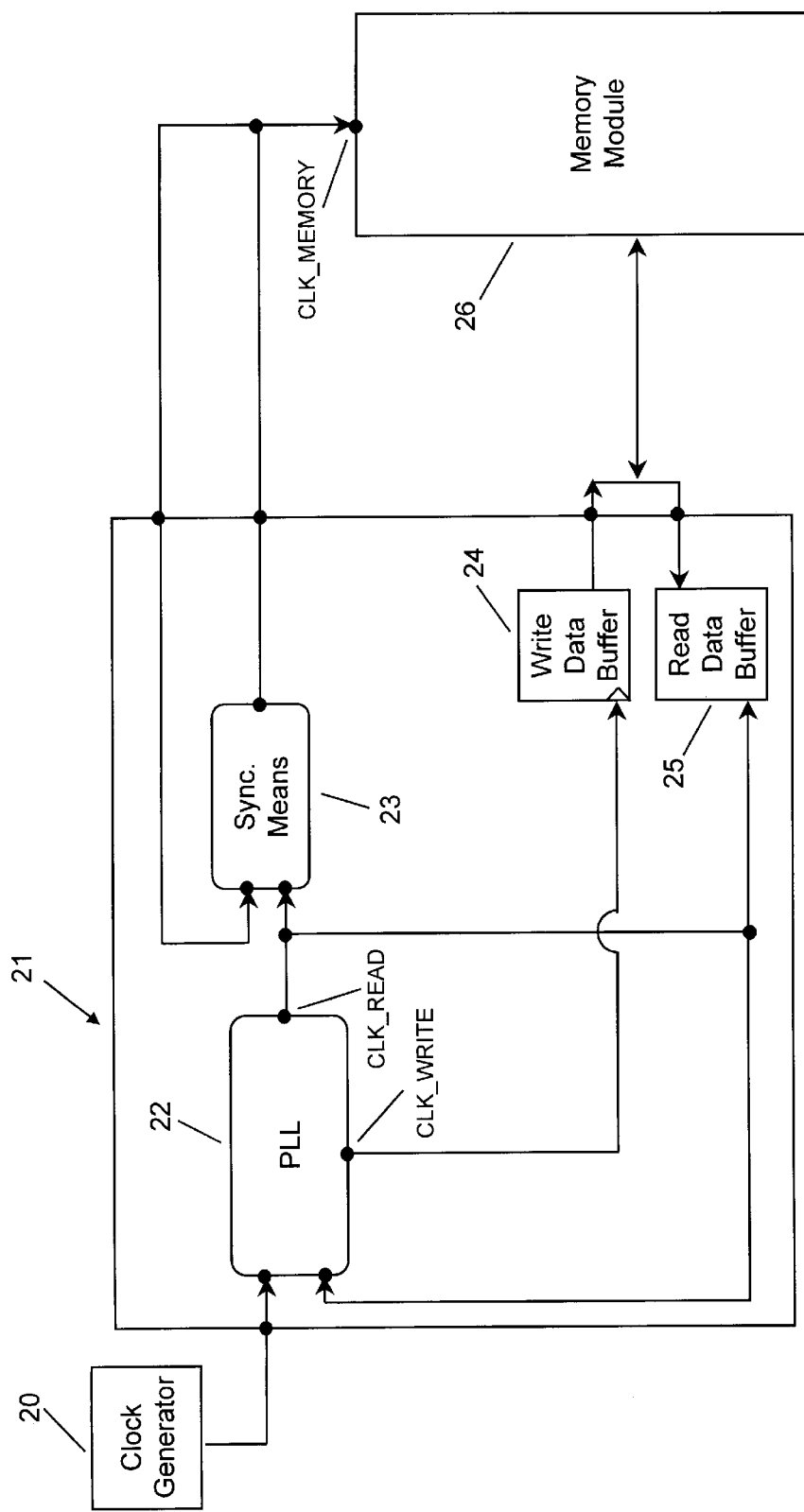
FIG. 2A is a simplified block diagram of a data processing system showing the elements of the memory read/write system of the present invention.

FIG. 2A is a simplified block diagram of the elements of memory read/write data processing system 27 designed in accordance with the present invention. A clock generator 20 generates a clock signal for a memory controller 21. Memory controller 21 includes phase lock loop means 22 for generating a read clock signal CLK_READ for read data buffer 25 and a write clock signal CLK_WRITE for write data buffer 24, wherein CLK_WRITE leads CLK_READ. CLK_READ feeds back to the phase lock loop means 22 for synchronization with the clock signal generated by clock generator 20. Memory controller 21 also includes synchronization means 23 for generating a memory clock signal CLK_MEMORY for the memory module 26. The synchronization means 23 generates the memory clock signal CLK_MEMORY in response to CLK_READ and CLK_MEMORY fedback from the memory module 26. CLK_MEMORY has a phase lead relative to CLK_READ and a phase lag relative to CLK_WRITE. The phase lead and the phase lag compensate for the phase difference between clock signals arriving at the memory module 26, read data buffer 25, and write data buffer 24 due to phase delays resulting from the different paths among clock generator 20 and the memory module 26, read data buffer 25, and write data buffer 24 respectively, thereby synchronizing the clock signals in data processing system 27.

Figure 2B:
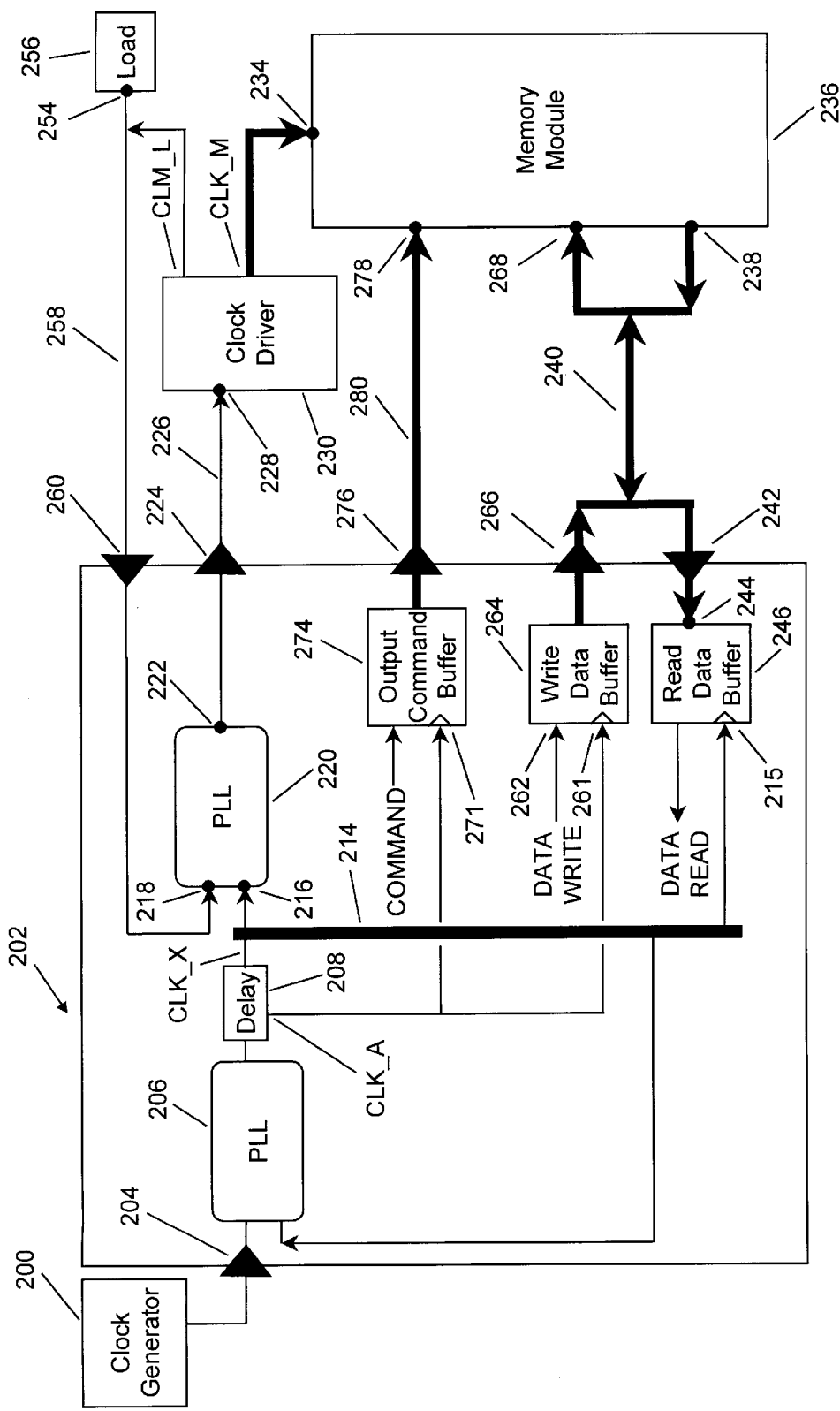
FIG. 2B is a preferred embodiment of a data processing system with memory read/write designed in accordance with the present invention.

A preferred embodiment of the present invention is described with reference to FIGS. 2B, 3, and 4. FIG. 2B shows a complete data processing system 290 designed in accordance with the present invention. Data processing system 290 includes a clock generator 200 for generating a clock signal for a memory controller 202. The clock signal enters memory controller 202 via an input pad 204.

Memory controller 202 includes a PLL circuitry HOST_PLL 206 for synchronization of the clock signal of a clock trunk 214 with the clock signal generated by clock generator 200. Clock trunk 214 provides a reference clock signal for various components inside memory controller 202. The output clock signal of HOST_PLL 206 is transmitted to a phase delay element 208. Phase delay element 208 generates two different phase delay clock signals. One is CLK_X with a constant delay $T_x$ and the other is CLK_A with an adjustable delay $T_a \leq T_x$.

The clock signal CLK_X is fed to clock trunk 214. Because clock trunk 214 can provide skewless clock signals all over the trunk, the clock signal at node 216 from clock trunk 214 provided for a MEM_PLL 220 can be regarded as reference clock signal to synchronize the clock signal at node 218 from the outside of the controller 202 via input pad 260 of memory controller 202. The clock signal at output node 222 of MEM_PLL 220 is transmitted to a clock driver 230 via output pad 224, a signal line 226, and input port 228 of clock driver 230.

Clock driver 230 generates a plurality of skewless clock signals CLK_M for SDRAM 236. Clock driver 230 also generates a clock signal CLK_L coupled to an equivalent load 256 having an input capacitance equivalent to that of a DIMM (Dual Inline Memory Module) of SDRAM 236. The number of clock signals CLK_M corresponds to the number of DIMM slots of SDRAM 236. Because clock driver 230 only need maintain the same trace length to SDRAM 236 and equivalent load 256 and need not consider the other components on the circuit board, it is easier to maintain the same trace length from clock driver 230 to the clock input port 234 and node 254 if clock driver 230 is placed as close as possible to SDRAM 236.

Furthermore, using equivalent load 256 at node 254 simulates the behavior of the clock signal CLK_M at the clock input port 234 because the clock signal CLK_M will be delayed by the load of SDRAM 236. In this way, the clock signal CLK_L transmitted to node 254 can be regarded as being almost the same as the clock signal CLK_M transmitted to the clock input port 234 of SDRAM 236.

The clock signal CLK_L is also fed back into MEM_PLL 220 at node 218 via a signal line 258 and input pad 260 for synchronization with the reference clock signal at node 216. This clock signal from clock trunk 214 is also provided for triggering read data buffer 246 having a clock input 215. Read data buffer 246 is an edge trigger data buffer for data read to strobe data at the data input 244 of read data buffer 246 from SDRAM 236 via a data output port 238 of SDRAM 236. In the specific embodiment of the present invention, read data buffer 246 is a positive edge trigger data buffer. The data is transmitted through data bus 240 and input pad 242. The other clock signal CLK_A with an adjustable delay $T_a \leq T_x$ is provided for triggering write data buffer 264 having a clock input 261. Write data buffer 264 is also an edge trigger data buffer for data write to transmit data at data input 262 of write data buffer 264. In the preferred embodiment of the present invention, write data buffer 264 is a positive edge trigger data buffer. The data is transmitted to SDRAM 236 through output pad 266, data bus 240, and data input port 268 of SDRAM 236.

The clock signal CLK_A is also provided for triggering output command buffer 274 having a clock input 271. Output command buffer 274 is also an edge trigger buffer for storing the command signal transmitted to SDRAM 236. In the preferred embodiment of the present invention, output command buffer 274 is a positive edge trigger data buffer. The command signal is transmitted to SDRAM 236 via output pad 276, a command bus 280, and input port 278 of SDRAM 236. The command signal is used to determine the data read/write operations between memory controller 202 and SDRAM 236. Because SDRAM 236 has a different number of DIMMs, it will generate different phase delays, the delay $T_a$ being adjusted according to the number of DIMMs. A checking subroutine in the Basic I/O System (BIOS) will generate a suitable delay $T_a$ value for reliable data write operation. In addition, it is best that the trace lengths L of signal lines 258, command bus 280, and data bus 240 be as similar as possible.

In the preferred embodiment of the present invention, data processing system 290 operates at a frequency of $1/T_{PERIOD}$, with a clock period of $T_{PERIOD}$. Because the internal phase delay inside memory controller 202 is very short, it is negligible In this embodiment. Referring to FIG. 3, the clock signal at node 216 starts a new cycle at time t. The feedback clock signal CLK_L at node 218 is locked-on by MEM_PLL 220, so that the clock signal at node 216 and node 218 have the same phase. The clock signal CLK_L at node 254 has a $T_{PADIN}+T_L$ phase lead compared to node 218, where $T_{PADIN}$ is the input pad delay at input pad 260 of memory controller 202, and $T_L$ is the phase delay due to the signal traveling the length L from node 254 to input pad 260. Because all the clock signals at node 254 and at the clock input port 234 of SDRAM 236 are transmitted from the skewless clock driver 230, the clock signal at node 254 has substantially the same phase as the clock signals at the clock input port 234 of SDRAM 236.

Considering the data transmitted from SDRAM 236 to read data buffer 246, when the clock signals CLK_M at the clock input port 234 of SDRAM 236 are fed to SDRAM 236, SDRAM 236 requires an access time $T_{ACCESS}$ to output the data to the data output port 238 of SDRAM 236. The data stream at data input 244 of read data buffer 246 have a $T_L+T_{PADIN}$ phase delay, where $T_L$ is the phase delay due to the signal traveling the length L from the data output port 238 to input pad 242, and $T_{PADIN}$ is the input pad delay at input pad 242 of memory controller 202. Accordingly, the total phase delay from the clock input port 234 of SDRAM 236 to the data input 244 of read data buffer 246 is $T_{ACCESS}+T_L+T_{PADIN}$, and the total phase lead from node 218 to node 254 is $T_L+T_{PADIN}$. As mentioned above, the clock signal CLK_L at node 254 can be regarded as being almost the same as the clock signal CLK_M at the clock input port 234, and the clock signal at node 216 and node 218 have the same phase. That means that the clock signal at node 254 or the clock input port 234 of SDRAM 236 at time $t-(T_L+T_{PADIN})$ is that at node 218 or node 216 at time t, and the data stream arrives at the data input 244 of read data buffer 246 at time $t-(T_L+T_{PADIN})+T_{ACCESS}+(T_L+T_{PADIN})=t+T_{ACCESS}$.

If read data buffer 246 can strobe the data stream at the data input 244 correctly, it is necessary to trigger read data buffer 246 at time $t+T_{ACCESS}+T_{SETUP-F}$, where $T_{SETUP-F}$ is the setup time of read data buffer 246. However, the clock signal at node 216 or at the clock input 215 has rising edges at time t, $t+T_{PERIOD}$, . . . Accordingly, read data buffer 246 can strobe the data stream at the data input 244 correctly at time $t+T_{PERIOD}$ provided it satisfies the following inequation, $$t+T_{ACCESS}+T_{SETUP-F} \leq t+T_{PERIOD} \leq t+T_{ACCESS}+T_{PERIOD}-T_{HOLD-F} \quad (1)$$

or equivalently, $$T_{PERIOD}-T_{ACCESS} \geq T_{SETUP-F} \quad (2)$$

and $$T_{ACCESS} \geq T_{HOLD-F} \quad (3)$$

For example, for a 100 MHz/133 MHz data bus, $T_{PERIOD}$ is 10 ns/7.5 ns and $T_{ACCESS}$ is 8 ns/6 ns for SDRAM supporting an operating frequencies of 100 MHz/133 MHz respectively. In accordance with inequations (2) and (3), there is a 2 ns/1.5 ns and 8 ns/6 ns provided as setup time and hold time for read data buffer 246. However, the setup time and hold time for a flip-flop are about 1 ns under 0.35 μm process. Accordingly, there is a sufficient setup time margin provided by using MEM_PLL 220 to produce a phase lead clock signal to SDRAM 236 compared to read data buffer 246 for correct data strobe operation under higher operating frequencies. In addition, it also satisfies the hold time requirement.

Figure 3:
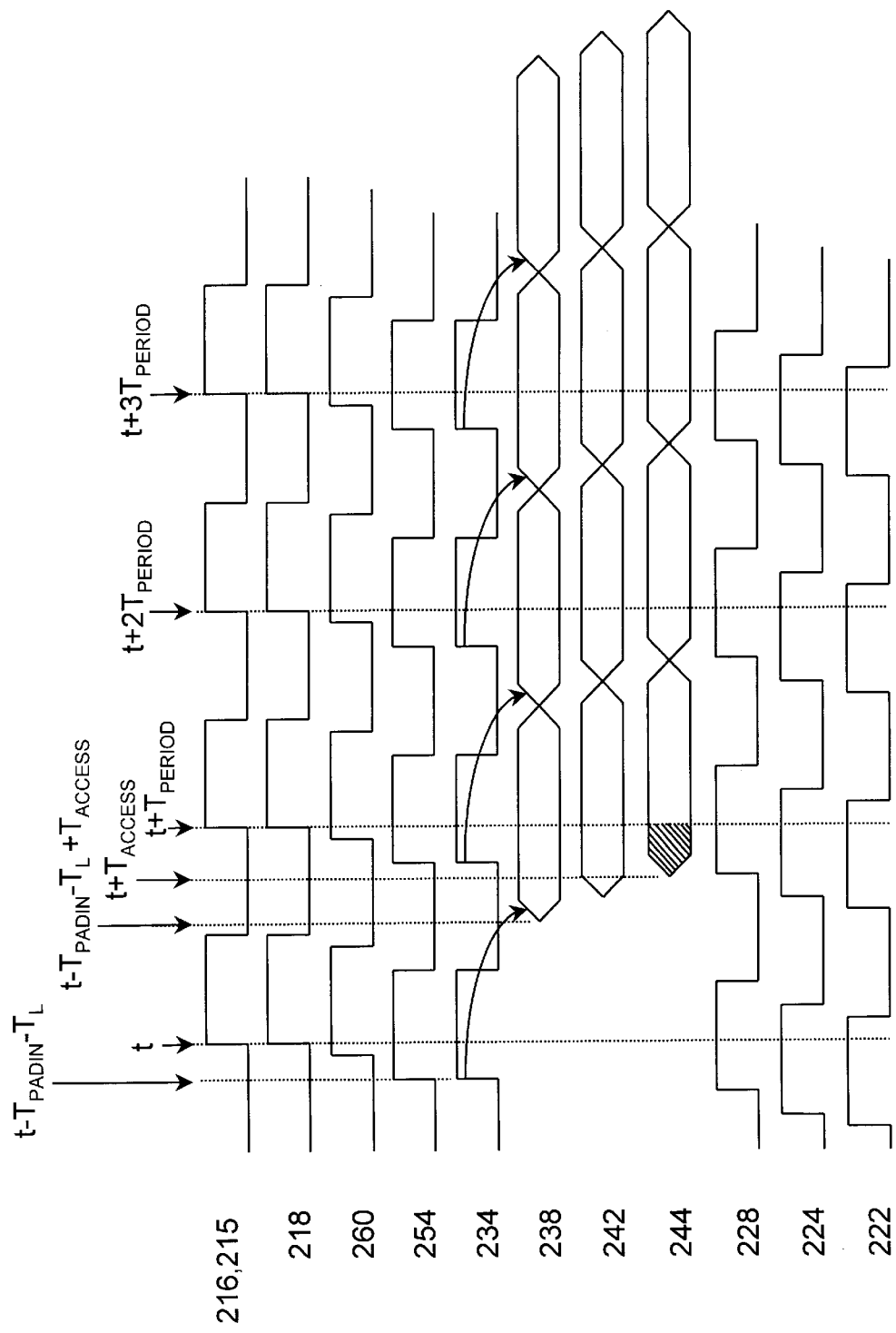
FIG. 3 is a timing diagram for a data read cycle in accordance with the present invention.

As shown in FIG. 3, the clock signal CLK_M at the clock input port 234 of SDRAM 236 has a phase lead of $T_L+T_{PADIN}$ over the clock signal at the clock input 215 of read data buffer 246. This means data transmitted from SDRAM 236 to memory controller 202 arrives a phase of $T_L+T_{PADIN}$ earlier at the data input 244 thereby providing more time for the setup operation of read data buffer 246.

Considering the data transmitted from write data buffer 264 to SDRAM 236, the clock signal CLK_A at the clock input 261 of write data buffer 264 has a $T_x-T_a$ phase lead over that at node 216. Referring to FIG. 4, the clock signal at node 216 starts a new period at time t. Hence, write data buffer 264 is triggered to transmit the data stream at data input 262 of write data buffer 264 to SDRAM 236 at time $t-(T_x-T_a)$. The data stream arriving at the data input port 268 of SDRAM 236 has a $T_{CO}+T_{PADOUT}+T_L+T_{CL}$ phase delay over those inside write data buffer 264; where $T_{CO}$ is the internal delay of write data buffer 264, $T_{PADOUT}$ is the output pad delay at output pad 266, $T_L$ is the delay by the signal traveling the length L from output pad 266 to the data input port 268, and $T_{CL}$ is the delay caused by loading of SDRAM 236. Accordingly, the arrival time of the data stream at the data input port 268 is at $t-T_x+T_a+T_{CO}+T_{PADOUT}+T_L+T_{CL}$. On the other hand, the rising time of the clock signal CLK_M at the clock input port 234 is at $t-T_{PADIN}-T_L$, $t-T_{PADIN}-T_L+T_{PERIOD}$, . . . as mentioned above. Accordingly, SDRAM 236 can strobe the data stream at the data input port 268 of SDRAM 236 correctly at time $t-T_{PADIN}-T_L+T_{PERIOD}$ provided it satisfies the following inequation, $$T_{SETUP-S} \leq (t-T_{PADIN}-T_L+T_{PERIOD})-(t-T_x+T_a+T_{CO}+T_{PADOUT}+T_L+T_{CL}) \leq T_{PERIOD}-T_{HOLD-S} \quad (4)$$

or equivalently, $$T_{SETUP-S} \leq T_{PERIOD}-T_{PADOUT}-T_{PADIN}-2T_L-T_{CO}-T_{CL}+T_x-T_a \leq T_{PERIOD}-T_{HOLD-S} \quad (5)$$

where $T_{SETUP-S}$ is the setup time of SDRAM 236, and $T_{HOLD-S}$ is the hold time of SDRAM 236. The adjustable delay $T_a$ is used to provide a phase lead to write data buffer 264 compared to SDRAM 236 to obtain a more reliable setup time for SDRAM 236 under higher operation frequency. At the same time, it must also satisfy the requirement of the hold time for SDRAM 236.

For example, for a 100 MHz data bus, $T_{PERIOD}$ is 10 ns, and $T_{SETUP-S}$ and $T_{HOLD-S}$ is 3 ns and 1 ns respectively for 8 ns SDRAM supporting an operation frequency of 100 MHz. In addition, $T_{PADIN}$ and $T_{PADOUT}$ is 2 ns and 2.5 ns under 10 pf load, and $T_{CO}$ is 0.5 ns. Hence, Inequation (5) can be simplified as follow, $$2T_L+T_{CL}-2 \leq T_x-T_a \leq 2T_L+T_{CL}+4 \quad (6)$$

Accordingly, SDRAM 236 can strobe the data stream at the data input port 268 of SDRAM 236 correctly at time $t-T_{PADIN}-T_L+T_{PERIOD}$ provided $T_x-T_a$ can satisfy the requirement of Inequation (6).

As shown in FIG. 4, the clock signal at the clock input 261 of write data buffer 264 has a phase difference of $T_x-T_a-T_L-T_{PADIN}$ lead over the clock signal CLK_M at the clock input port 234 of SDRAM 236. That means data transmitted from memory controller 202 to SDRAM 236 arrives a phase of $T_x-T_a-T_L-T_{PADIN}$ earlier at the data input port 268 to obtain more time for setup operation of SDRAM 236. As mentioned above, a checking subroutine in the Basic I/O System (BIOS) will generate a suitable delay $T_a$ value for reliable data write operation.

In summary, the preferred embodiment of the present invention can solve the clock skew problems by using PLL circuitry inside a chip in combination with an adjustable phase delay element for synchronization of the clock signals of components inside the chip with the clock signals of components outside the chip to obtain a more reliable setup time for correct data processing operation under high operating frequencies. When the core frequencies inside the components increase in the future, this invention will provide an even more cost effective means to solve phase synchronization problems. The PLL circuitry MEM_PLL 220 is used to provide a phase lead to SDRAM 236 compared to read data buffer 246 to obtain a more reliable setup time for data read operation under higher operating frequencies. Phase delay element 208 provides two different phase delay signals CLK_X with a constant delay $T_x$ and CLK_A with an adjustable delay $T_a \leq T_x$. The adjustable delay output clock signal CLK_A is used to provide a phase lead for data from data buffer 264 to satisfy the requirements of SDRAM 236 setup time and hold time in concurrence with data write operations under the higher operating frequencies. In addition, the other PLL circuitry HOST_PLL 206 provides a phase lead over the clock signal via input pad 204 into memory controller 202 to compensate for the phase delay $T_x$ due to phase delay element 208.

This invention has been described in a preferred embodiment thereof. Accordingly, the above description and illustrations should not be construed as limiting the scope of the invention. Various changes and modifications, such as using a memory module, a data buffer, or a storage element of other devices (e.g., memory module of interface cards) in a data processing system or any other system which uses memory read/write operations (e.g., instead of SDRAMs) or multifunctional controllers including the memory controller (e.g., instead of the memory controllers), may be made by those skilled in the art without changing the scope or spirit of the invention which is defined by the following claims.

What is claimed is:

1. A data processing system comprising:
    a clock generator for generating a clock signal;
    a memory module for storing data;
    a memory controller, coupled to said clock generator, having
        command means coupled to said memory module for generating a command signal having a first status and a second status,
        phase lock loop means, responsive to said clock signal, for generating a read clock signal and a write clock signal, said write clock signal leading said read clock signal,
        a write data buffer coupled to said memory module, said write data buffer providing data to said memory module in response to said write clock signal and when said command signal is in said first status,
        a read data buffer coupled to said memory module, said read data buffer strobing data, when said command signal is in said second status, said strobed data being read from said memory module in response to said read clock signal, said read clock signal being fedback to said phase lock loop means to generate a substantially in-phase read clock signal, and
        synchronization means for generating a memory clock signal, said memory clock signal having a phase lead relative to said read clock signal and having a phase lag relative to said write clock signal, said memory clock signal triggering said memory module to strobe data from said write data buffer when said command signal is in said first status and transmit data to said read data buffer when said command signal is in said second status;
    wherein said phase lead and said phase lag compensate for the phase difference between clock signals arriving at said memory module, said read data buffer, and said write data buffer due to phase delays resulting from the different paths among said clock generator and said memory module, said read data buffer, and said write data buffer respectively.

2. The data processing system of claim 1 further comprising a feedback signal path for feeding back said memory clock signal from said memory module to said synchronization means.

3. The data processing system of claim 2, wherein said synchronization means generates said memory clock signal in response to said fedback memory clock signal and said read clock signal.

4. The data processing system of claim 1, wherein said phase lock loop means includes a phase lock loop for synchronizing said read clock signal with said clock signal, and a delay means, coupled to said phase lock loop, for providing said write clock signal and said read clock signal.

5. The data processing system of claim 1, wherein said read data buffer and said write data buffer are clock signal edge-triggered.

6. A memory controller, coupled to a clock generator, for use with a memory module, the clock generator generating a clock signal, said memory controller comprising:
    command means coupled to the memory module for generating a command signal having a first status and a second status;
    phase lock loop means, responsive to the clock signal, for generating a read clock signal and a write clock signal, said write clock signal leading said read clock signal;
    a write data buffer coupled to the memory module, said write data buffer providing data to the memory module in response to said write clock signal and when said command signal is in said first status;
    a read data buffer coupled to the memory module, said read data buffer strobing data, when said command signal is in said second status, said strobed data being read from the memory module in response to said read clock signal, said read clock signal being fedback to said phase lock loop means to generate a substantially in-phase read clock signal;
    synchronization means for generating a memory clock signal, said memory clock signal having a phase lead relative to said read clock signal and having a phase lag relative to said write clock signal, said memory clock signal triggering the memory module to strobe data from said write data buffer when said command signal is in said first status and transmit data to said read data buffer when said command signal is in said second status;

wherein said phase lead and said phase lag compensate for the phase difference between clock signals arriving at the memory module, said read data buffer, and said write data buffer due to phase delays resulting from the different paths among the clock generator and the memory module, said read data buffer, and said write data buffer respectively.

7. The memory controller of claim 6, wherein said synchronization means generates said memory clock signal in response to said read clock signal and said memory clock signal fedback from the memory module.

8. The memory controller of claim 6, wherein said phase lock loop means includes a phase lock loop for synchronizing said read clock signal with said clock signal, and a delay means, coupled to said phase lock loop, for providing said write clock signal and said read clock signal.

9. The memory controller of claim 6, wherein said read data buffer and said write data buffer are clock signal edge-triggered.

10. In a data processing system, a method for compensating for phase differences between clock signals arriving at a read data buffer and a write data buffer of a memory controller, and a memory module respectively, the phase differences due to phase delays resulting from the different paths thereamong, comprising the steps of:

(a) generating a write clock signal for said write data buffer and a read clock signal for said read data buffer, said write clock signal leading said read clock signal; and (b) generating a memory clock signal for said memory module leading said read clock signal and lagging said write clock signal, thereby synchronizing the clock signals.

11. The method of claim 10 wherein step (b) comprises the steps of:

(b1) feeding back said memory clock signal from said memory module to said memory controller; and (b2) synchronizing said fedback memory clock signal with said read clock signal to generate said memory clock signal.

12. The method of claim 11 wherein step (b2) utilizes a phase lock loop to synchronize said fedback memory clock signal.

13. The method of claim 10 further comprising the steps following step (b) of:

generating a write command signal and a read command signal;

transmitting data from said write data buffer to said memory module in response to said write command signal, said write clock signal, and said memory clock signal; and transmitting data from said memory module to said read data buffer in response to said read command signal, said read clock signal, and said memory clock signal.

14. A memory controller, coupled to a clock generator, for compensating for phase differences between clock signals arriving at a read data buffer and a write data buffer of a memory controller, and a memory module respectively, the phase differences due to phase delays resulting from the different paths thereamong, the clock generator generating a clock signal, said memory controller comprising:

phase lock loop means, responsive to the clock signal, for generating a read clock signal for said read data buffer and a write clock signal for said write data buffer, said write clock signal leading said read clock signal; and synchronization means for generating a memory clock signal for the memory module, said memory clock signal leading said read clock signal and lagging said write clock signal, thereby synchronizing the clock signals.

15. The memory controller of claim 14, wherein said synchronization means generates said memory clock signal in response to said read clock signal and said memory clock signal feedback from the memory module.

16. The memory controller of claim 14, wherein said phase lock loop means includes a phase lock loop for synchronizing said read clock signal with the clock signal, and a delay means, coupled to said phase lock loop, for providing said write clock signal and said read clock signal.

17. The memory controller of claim 14, wherein said read data buffer, said write data buffer, and the memory module are clock signal edge-triggered.

* * * * *